(12) United States Patent
Akiduki (10) Patent No.: US 11,984,332 B2
(45) Date of Patent: May 14, 2024

(54) CONTAINER AND METHOD FOR CHARGING SUBSTRATE-LIKE SENSOR

(71) Applicant: Tokyo Electron Limited, Tokyo (JP)

(72) Inventor: Yuuji Akiduki, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 617 days.

(21) Appl. No.: 17/168,555

(22) Filed: Feb. 5, 2021

(65) Prior Publication Data

US 2021/0257234 A1  Aug. 19, 2021

(30) Foreign Application Priority Data

Feb. 13, 2020 (JP) ................................ 2020-022759

(51) Int. Cl.
*H01L 21/67* (2006.01)
*G01D 11/24* (2006.01)
*H02J 7/00* (2006.01)

(52) U.S. Cl.
CPC ...... *H01L 21/67242* (2013.01); *G01D 11/245* (2013.01); *H02J 7/0042* (2013.01)

(58) Field of Classification Search
CPC . H02J 7/0042; H01L 21/67242; G01D 11/245
USPC ........................................................ 320/107
See application file for complete search history.

(56) References Cited

U.S. PATENT DOCUMENTS

| 6,781,205 B1* | 8/2004 | Levit ................. H01L 21/67253 206/711 |
| 7,531,984 B2* | 5/2009 | Freed .................... H02J 50/005 320/109 |
| 2021/0028044 A1* | 1/2021 | Vellore ............. H01L 21/67383 |
| 2021/0050242 A1* | 2/2021 | Sakata ............. H01L 21/67778 |
| 2021/0151338 A1* | 5/2021 | Chandrasekaran ......................... G01N 21/9501 |

FOREIGN PATENT DOCUMENTS

| JP | 2002-261159 | 9/2002 |
| JP | 2004-153119 | 5/2004 |
| JP | 2005-202933 | 7/2005 |
| JP | 2005-521926 | 7/2005 |
| JP | 2016-500929 | 1/2016 |
| WO | 2003/067183 | 8/2003 |

* cited by examiner

*Primary Examiner* — Nathaniel R Pelton
(74) *Attorney, Agent, or Firm* — IPUSA, PLLC (57) ABSTRACT

A container for a substrate-like sensor with a terminal includes a main body having an opening, and a support disposed in the main body and configured to support the substrate-like sensor. The container includes a contact pin disposed in the main body and configured to contact the terminal of the substrate-like sensor, and a drive mechanism configured to drive the contact pin. The container includes a jack disposed outside the main body and electrically connected to the contact pin, and a cover for allowing the opening of the main body to be closed.

9 Claims, 4 Drawing Sheets

CONTAINER AND METHOD FOR CHARGING SUBSTRATE-LIKE SENSOR

CROSS REFERENCE TO RELATED APPLICATION

This patent application claims priority to Japanese Patent Application No. 2020-22759, filed Feb. 13, 2020, the entire contents of which are incorporated herein by reference in their entirety.

TECHNICAL FIELD

The present disclosure relates to a container and a method for charging a substrate-like sensor.

BACKGROUND

Semiconductor processing systems are disclosed in which substrate-like sensors are transferred using transfer devices for transferring substrates such as wafers.

Japanese Translation of PCT International Application Publication No. 2005-521926, which is referred to as Patent document 1, and Japanese Unexamined Patent Publication No. 2005-202933, which is referred to as Patent document 2, disclose wireless substrate-like sensors each of which is removed by a robot from a housing, and the robot also transfers the wireless substrate-like sensor to a reference target.

SUMMARY

According to one aspect of the present disclosure, the present disclosure provides a container for a substrate-like sensor including a terminal. The container includes a main body having an opening, a support disposed in the main body and configured to support the substrate-like sensor, a contact pin disposed in the main body and configured to contact the terminal of the substrate-like sensor, a drive mechanism configured to drive the contact pin, a jack disposed outside the main body and electrically connected to the contact pin, and a cover for allowing the opening or the main body to be closed.

DETAILED DESCRIPTION

One or more embodiments of the present disclosure will be described with reference to the drawings. In each drawing, the same numerals denote the same components, and duplicate explanations for the component may be omitted.

Configuration of Whole Semiconductor Manufacturing Apparatus

Figure 1:
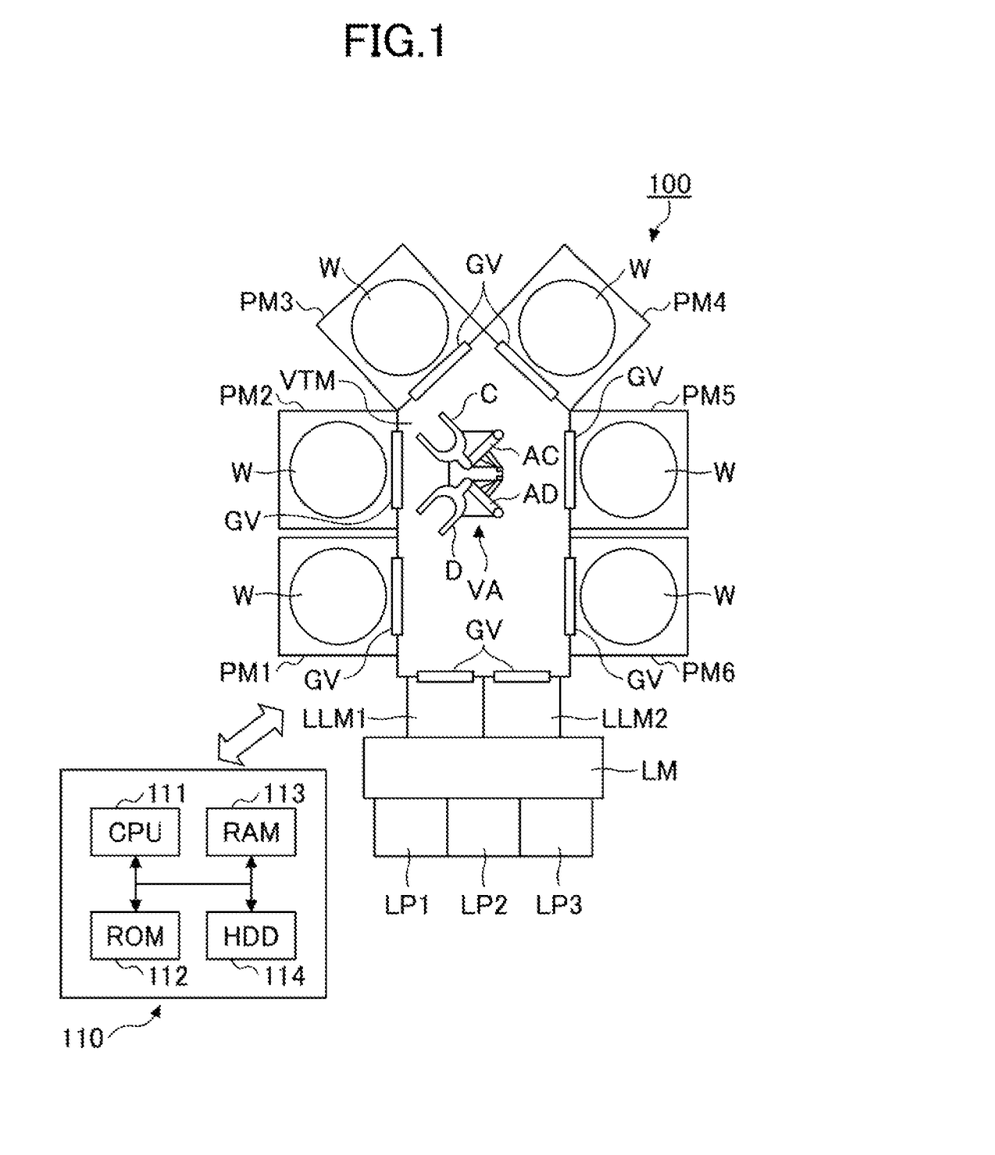
FIG. 1 is a diagram illustrating an example of the configuration of the whole semiconductor manufacturing apparatus according to one embodiment.

An example of a longitudinal section of a semiconductor manufacturing apparatus 100 will be hereafter described with reference with FIG. 1. The semiconductor manufacturing apparatus 100 illustrated in FIG. 1 is an apparatus having a cluster structure (multiple chamber type). A vacuum transfer module VTM and a substrate process module PM are each examples of a vacuum apparatus.

The semiconductor manufacturing apparatus 100 in FIG. 1 includes substrate process modules PM1 to PM6, a vacuum transfer module VTM, load lock modules LLM1 and LLM 2, a loader module LM, and load ports LP1 to LP3.

The semiconductor manufacturing apparatus 100 is controlled by a controller 110 and performs a predetermined process of a semiconductor wafer W (thereafter also referred to as a "wafer W"), which is an example of a substrate.

The substrate process modules PM1 to PM6 are each disposed adjacent to the vacuum transfer module VTM. The substrate process modules PM1 to PM6 are also collectively referred to as substrate process modules PM. When a corresponding gate valve GV is open, each of the substrate process modules PM1 to PM6 communicates with the vacuum transfer module VTM. Each of the substrate process modules PM1 to PM6 is depressurized to a predetermined vacuum atmosphere, and a given wafer W is processed in an interior of the substrate process module, by etching, deposition, cleaning, ashing, and the like.

A transfer device VA that transfers one or more wafers W is disposed in an interior of the vacuum transfer module VTM. The transfer device VA has two robotic arms AC and AD each of which is stretchable and rotatable. Picks C and D are attached to tips of the robotic arms AC and AD, respectively. The transfer device VA can hold a given wafer W with each of the picks C and D. When a corresponding gate valve GV is open, the transfer device VA loads or unloads a given wafer W between each of the substrate process modules PM1 to PM6 and the vacuum transfer module VTM. Further, when a corresponding gate valve GV is open, the transfer device VA loads or unloads a given wafer W between the vacuum transfer module VTM and each of the load lock modules LLM1 and LLM2.

The load lock modules LLM1 and LLM2 are each provided between the vacuum transfer module VTM and the loader module LM. The atmosphere of each of the load lock modules LLM1 and LLM2 is switched between an air atmosphere and a vacuum atmosphere. In this case, a given wafer W is transferred from an air space of the loader module LM to a vacuum space of the vacuum transfer module VTM. Alternatively, a given wafer W is transferred from a vacuum space of the vacuum transfer module VTM to an air space of the loader module LM.

The loader module LM is provided with load ports LP1 to LP3. A front opening unified pod (FOUP) that accommodates, e.g., 25 wafers W, or an empty FOUP, is mounted on each of the load ports LP1 to LP3. The loader module LM transfers a given wafer W, which is removed from the FOUP in a given load port LP among the lord ports LP1 to LP3, to a given load lock module among the load lock modules LLM1 and LLM2. The loader module LM also transfers a given wafer W, which is transferred from a given load lock module among the load lock modules LLM1 and LLM2, to a given FOUP.

The controller 110 includes a central processing unit (CPU) 111, a read only memory (ROM) 112, a random access memory (RAM) 113, and a hard disk drive (HDD) 114. In addition to the HDD 114, the controller 110 may have another storage area such as a solid state drive (SSD). A recipe in which a process procedure, a process condition, a transfer condition, and the like are set is stored in storage areas such as the HDD 114 and the RAM 113.

In accordance with the recipe, the CPU 111 controls the process of the wafer W in each substrate process module PM and controls the transfer of the wafer W. In the present embodiment, the CPU 111 also controls the supply of a gas, the process such as an exhausting control, particle measurement, and the like. The HDD 114 or the RAM 113 may store one or more programs for executing a process such as a transferring process of a substrate, a cleaning process, or an exhausting control process. The programs may be stored in a storage medium to be provided externally, or may be provided by an external device through a network.

Note that the number for each of substrate process modules PM, the load lock modules LLM, and the load ports LP is not limited to the number described in the present embodiment, and may be one or more.

With such a configuration, in the semiconductor manufacturing apparatus 100, a FOUP accommodating wafers W, or an empty FOUP can be attached to each of the load ports LP1 to LP3. Further, in the semiconductor manufacturing apparatus 100, before processed, a given wafer W accommodated in the FOUP is removed from the FOUP, and then the removed wafer W can be transferred to each of the substrate process modules PM1 to PM6, through the loader module LM, a given load module among the load lock modules LLM1 the LLM2, and the vacuum transfer module VTM. Moreover, in the semiconductor manufacturing apparatus 100, the wafer W can be processed as suited in each of the substrate process modules PM1 to PM6. Further, the semiconductor manufacturing apparatus 100, the processed wafer W is removed from each of the substrate process modules PM1 to PM6, and then the removed wafer W can be accommodated in a given FOUP, through the vacuum transfer module VTM, a given load module among the load lock modules LLM1 the LLM2, and the loader module LM.

Container

Figure 2:
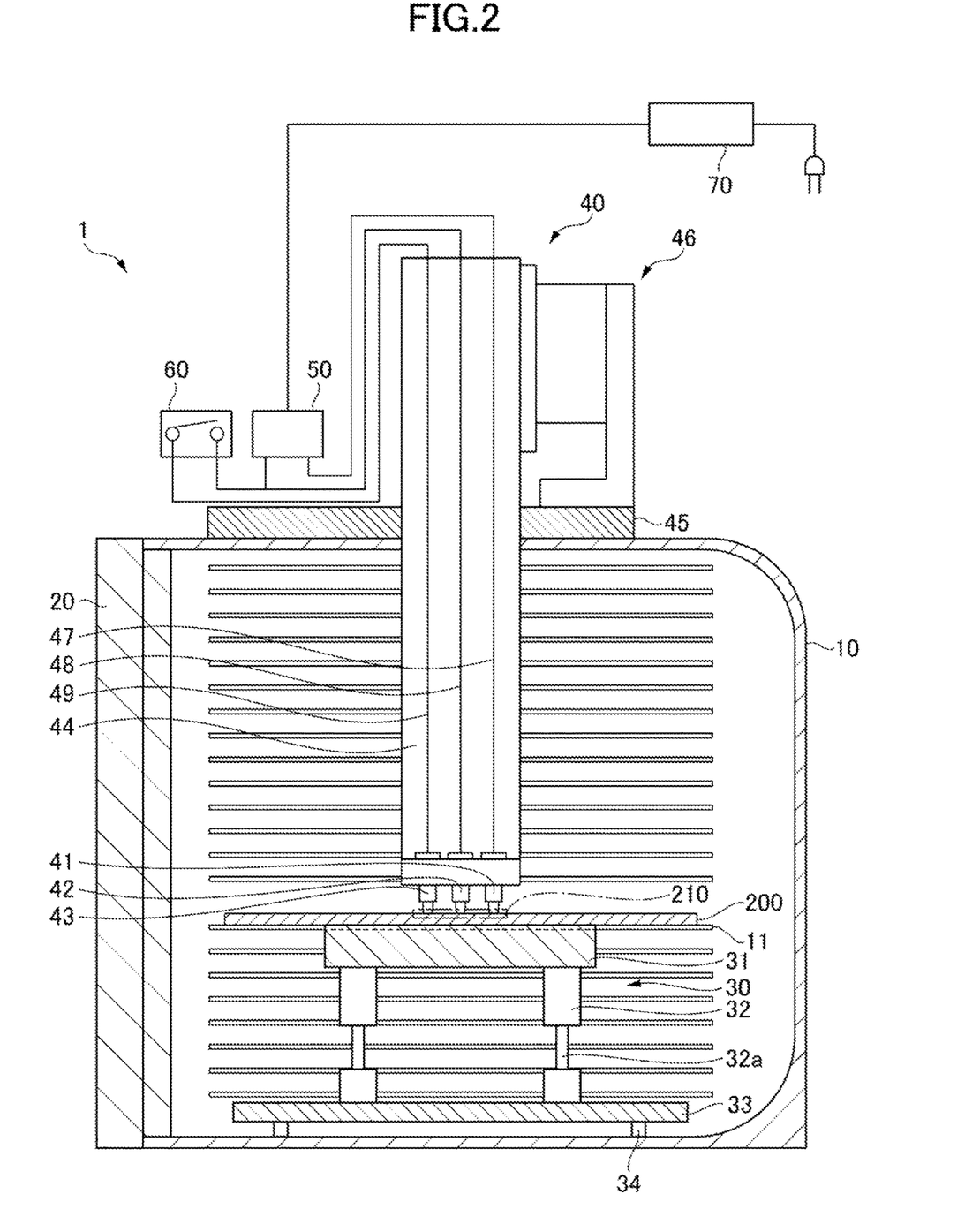
FIGS. 2 and 3 are cross-sectional views schematically illustrating an example of a container according to one embodiment.
Figure 3:
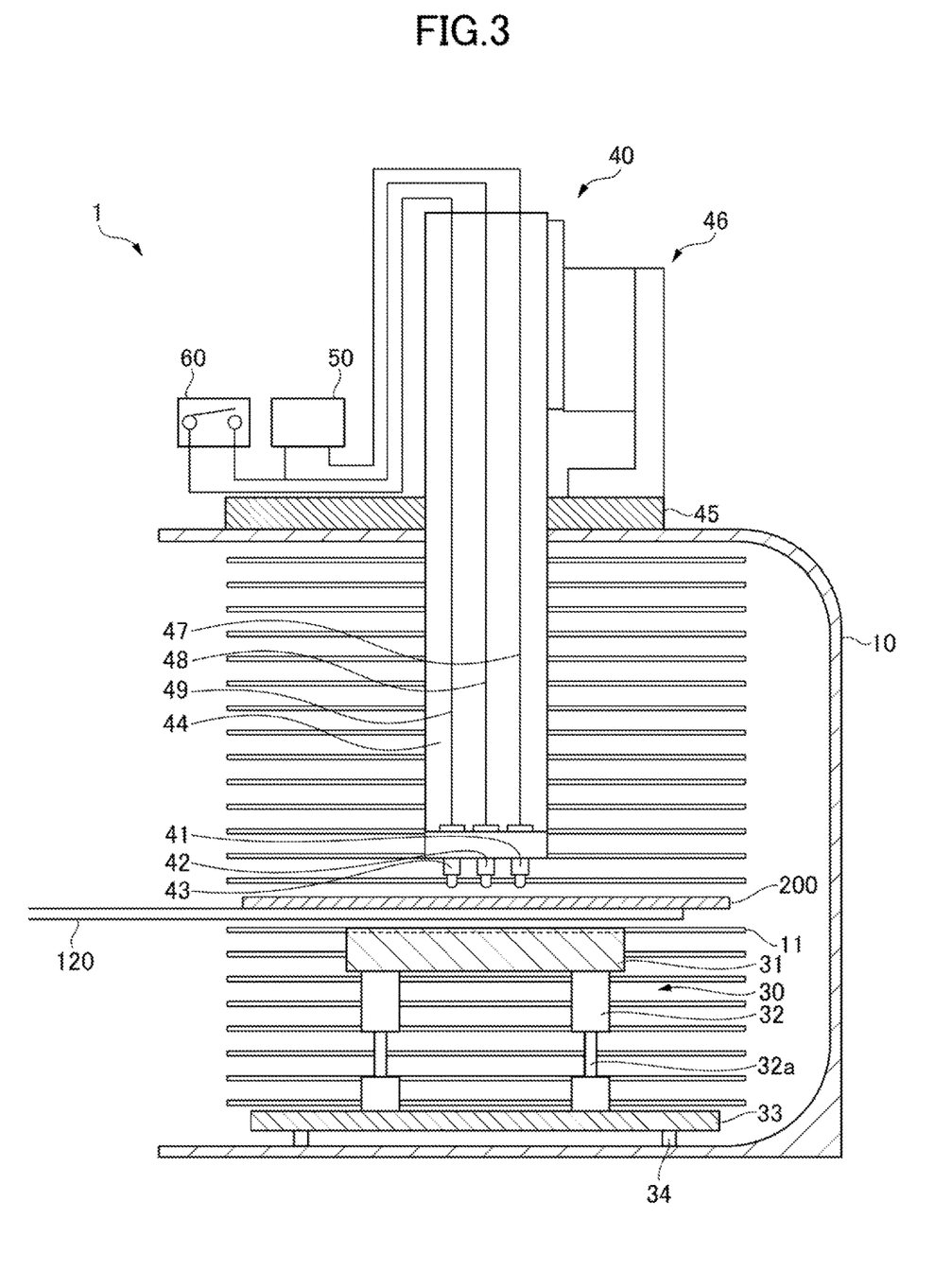

Hereafter, the container 1 according to the present embodiment will be described in detailed with reference to FIGS. 2 and 3. FIGS. 2 and 3 are cross-sectional views schematically illustrating an example of the container 1 according to the present embodiment. Note that in FIGS. 2 and 3, the left side of each paper is the front side (side of the container where the load ports LP1 to LP3 are connected) of the container 1, and the right side of each paper is the back side of the container 1. The back side of the paper is one side-surface side of the container 1, and the front side of the paper is another side-surface side of the container 1. FIG. 2 illustrates an example of a state such as a state in which the substrate-like sensor 200 accommodated in the container 1 is charged. FIG. 3 illustrates an example of a state in which the substrate-like sensor 200 is removed from the container 1 through an end effector 120 of a transfer device (not illustrated) in the loader module LM. In such a state, the container 1 is attached to a given load port LP (not illustrated in FIG. 3) and a cover 20 (not illustrated in FIG. 3) is removed by the load port LP.

The container 1 includes a main body 10 capable of accommodating the substrate-like sensor 200, and includes the cover 20 that is removably open or close at an open front of the main body 10.

The container 1 for accommodating one or more substrate-like sensors 200 has the same attachment configuration as the FOUP. Such a configuration allows the container 1 to be attached to each of the load ports LP1 to LP3. Each of the load ports LP1 to LP3 can open or close the cover 20 (see FIG. 2) of the container 1.

The substrate-like sensor 200 has a disc having the same diameter as the wafer W, for example. The substrate-like sensor 200 also includes one or more sensors 220 and the like (See FIG. 4 below. for example, one or more among a temperature sensor, a capacitance sensor, a humidity sensor, an acceleration sensor, an image sensor, and the like) disposed on the disk. With such a manner, the transfer device VA of the vacuum transfer module VTM and a transfer device (not illustrated) of the loader module LM can each transfer the substrate-like sensor 200, as in the case of the wafer W. Further, as in the case of the wafer W, the substrate-like sensors 200 can be mounted on a stage (not illustrated) in each of the substrate process modules PM1 to PM6. Moreover, the substrate-like sensor 200 can be mounted on a stage (not illustrated) in each of the load lock modules LLM1 and LLM2.

With such a configuration, in the semiconductor manufacturing apparatus 100, the container 1 accommodating the substrate-like sensor 200 can be attached to each of the load ports LP1 to LP3. Further, in the semiconductor manufacturing apparatus 100, the substrate-like sensor 200 accommodated in the container 1 is removed from the container 1 and then can be transferred to a predetermined measurement location (e.g., a given substrate process module among the substrate process modules PM1 to PM6), through the loader module LM, a given load lock module among the load lock modules LLM1 and LLM2, and the vacuum transfer module VTM. Moreover, in the semiconductor manufacturing apparatus 100, the substrate-like sensor 200 at a predetermined measurement location can be accommodated in the container 1 through the vacuum transfer module VTM, a given load lock module among the load lock modules LLM1 and LLM2, and the loader module LM. While transferred, or at a predetermined detection location, the substrate-like sensor 200 can detect various information (one or more targets among temperature, capacitance, humidity, acceleration, an image, and the like) by using one or more sensors 220 (see FIG. 4 below).

The main body is molded into a box of which the front is open. The front of the main body 10 has the same opening shape as the opening shape of the front of a standardized FOUP for accommodating one or more wafers W. As an example of a molding material of the main body 10, engineering plastic, such as polycarbonate (PC) or polybutylene terephthalate (PBT), can be used. More preferably, a low hygroscopic material is used for the main body 10.

Pairs of left and right teeth 11 that are horizontally formed shelf protrusions are provided inside right and left sidewalls of the main body 10. The substrate-like sensor 200 is mounted on a given pair of left and right teeth 11. In such a case, the pair of left and right teeth 11 horizontally supports the right and left peripheries of the back side of the substrate-like sensor 200.

A pair of teeth 11 may be provided on each of multiple stages in a height direction. In such a configuration, the pair of teeth 11 provided on each of the multiple stages in the height direction is formed at the same pitch as that set at a standardized FOUP for accommodating wafers W. In this case, a transfer device (not illustrated) of the loader module LM can remove the substrate-like sensor 200 from the container 1, as in the case of the operation performed when a given wafer W is removed from the FOUP. As the main body 10 of the container 1, a main body of the FOUP can be used. Note that in the example illustrated in FIGS. 2 and 3, the substrate-like sensor 200 is mounted on a pair of eighth stage teeth 11 from the bottom.

With respect to pairs of teeth 11 on the multiple stages, a pair of teeth 11 on a next stage of a given pair of teeth 11 on a given stage (in the example illustrated in FIGS. 2 and 3, the eighth stage from the bottom) where the substrate-like sensor 200 is supported may be formed at a pitch that is twice a pitch set for other stages. In other words, pairs of teeth 11 on multiple stages are formed by an equal pitch, except for a pair of teeth corresponding to a next stage (ninth stage from the bottom) of the stage where the substrate-like sensor 200 is supported. Thus, even when the substrate-like sensor 200 is thicker than the wafer W, the substrate-like sensor 200 can be accommodated in the main body 10. Further, when the substrate-like sensor 200 is removed from the container 1, even in a case where the end effector 120 of a transfer device (not illustrated) of the loader module LM raises the substrate-like sensor 200, the front side of the substrate-like sensor 200 can be prevented from contacting the back sides of teeth 11 on a next stage of the stage where the substrate-like sensor 200 is situated.

Note that a rear retainer (not illustrated) that supports the rear periphery of the back side of the substrate-like sensor 200 approximately and horizontally may be provided inside the rear sidewall of the main body 10. A front retainer (not illustrated) that supports the front periphery of the back side of the substrate-like sensor 200 approximately and horizontally may be also provided on the inner surface of the cover 20.

Handles (not illustrated) to be gripped by an operator that carries the container 1 may be provided outside the right and left sidewalls of the main body 10, as in the case of the FOUP. Rails (not illustrated) each serving as a guide to carry the container 1 may be also provided outside the right and left sidewalls of the main body 10, as in the case of the FOUP. One or more grooves (not illustrated), for positioning the container 1 when the container 1 is attached to a given load port among the load ports LP1 to LP3, may be provided outside the bottom wall of the main body 10, as in the case of the FOUP.

The cover 20 has the same configuration as a cover (not illustrated) of a standardized FOUP for accommodating wafers W. With such a configuration, the cover 20 can seal a front opening of the main body 10, in a state in which the substrate-like sensor 200 is accommodated in the main body 10. Each of the load ports LP1 to LP3 can open or close the cover 20 of the container 1, as in the case of a FOUP cover (not illustrated).

The container 1 includes a support 30 provided upright from inside the bottom wall of the main body 10. The support 30 includes a supporting block 31, supporting posts 32, a supporting plate 33, and supporting posts 34. The supporting plate 33 is secured to the bottom wall of the main body 10 via the supporting posts 34. The supporting block 31 is secured to the supporting plate 33 via the supporting posts 32. For example, three supporting posts 32 are provided and each supporting post has a height adjusting mechanism 32a. In such a manner, a height and a horizontal level of the front side of the supporting block 31 can be adjusted.

With the above configuration, when the substrate-like sensor 200 is accommodated in the container 1, and the right and left peripheries of the back side of the substrate-like sensor 200 are supported by the pair of teeth 11, the front side of the supporting block 31 supports the central portion of the back side of the substrate-like sensor 200.

A terminal 210 to be in contact with contact pins 41 to 43 described below is provided at the central portion of the front side of the substrate-like sensor 200. In other words, when the substrate-like sensor 200 is accommodated in the container 1, the supporting block 31 supports the substrate-like sensor 200, below the terminal 210. With such a configuration, even when the terminal 210 is pressed by the contact pins 41 to 43, deflection or the like of the substrate-like sensor 200 can be avoided.

The supporting block 31 formed in a disk shape. The diameter of the disk-shaped supporting block 31 is less than an opening width of the end effector 120 having a bifurcated shape. With such a configuration, when the substrate-like sensor 200 is removed from the container 1, even in a case when the end effector 120 of a transfer device (not illustrated) of the loader module LM is inserted under the substrate-like sensor 200, the end effector 120 and the supporting block 31 do not interfere.

Preferably, the support 30 disposed in the container 1 is formed of polytetrafluoroethylene (PTFE), for example. Also, the supporting block 31 to be in contact with the back side of substrate-like sensor 200 is preferably formed of polytetrafluoroethylene (PTFE), for example. In such a manner, abrasion powder generated from the supporting block 31 due to a friction between the back side of the substrate-like sensor 200 and the front side of the supporting block 31 can be reduced. Also, the process of the wafer W in each of the substrate process modules PM1 to PM6 is unlikely to be influenced by the abrasion powder described above.

The container 1 also includes a power supplying mechanism 40 for supplying power to the terminal 210 of the substrate-like sensor 200. The power supplying mechanism 40 includes the contact pins 41 to 43 for electrically contacting the terminal 210 of the substrate-like sensor 200. The contact pins 41 to 43 are supported at the lower end of a shaft member 44 that passes through the upper wall of the main body 10. A plate 45 is provided on the outside of the upper wall of the main body 10. The shaft member 44 passes through the upper wall of the main body 10 and the plate 45. Note that the shaft member 44 is movable relative to the upper wall of the main body 10 and the plate 45, in a penetrating direction of the upper wall of the main body 10 and the plate 45. Preferably, the shaft member 44 disposed in the container 1 is formed of polyacetal (POM), for example. Note that a seal (not illustrated) for sealing the main body 10 and allowing the shaft member 44 to axially move, is provided between the shaft member 44 and the plate 45.

A lifting mechanism (shaft driving mechanism) 46 for raising or lowering the shaft member 44 is provided on the plate 45. The fixed side of the lifting mechanism 46 is secured to the plate 45. The movable side of the lifting mechanism 46 is secured to the shaft member 44. For example, the lifting mechanism 46 includes a rack and pinion. When an operator rotates a rotation shaft with a handle provided on the fixed side of the lifting mechanism 46, a pinion rotates to cause a linear motion of a rack fixed on the movable side of the mechanism 46, and thereby the shaft member 44 is raised or lowered. Accordingly, the lifting mechanism 46 outside the main body 10 causes the contact pins 41 to 43 to be raised or lowered. In other words, the lifting mechanism 46 can switch a state of the contact pins 41 to 43, between a state in which the contact pins 41 to 43 contact the terminal 210 of the substrate-like sensor 200 (see FIG. 2) and a state in which the contact pins 41 to 43 are spaced apart from the terminal 210 of the substrate-like sensor 200 (see FIG. 3).

Wires 47 to 49 are provided in an interior of the shaft member 44. The container 1 also includes a direct current (DC) jack 50 and a switch 60. The wire 47 is, for example, a power supply line. One end of the wire 47 is connected to the contact pin and another end is connected to one terminal of the DC jack 50. The wire 48 is, for example, a ground (GND) line. One end of the wire 45 is connected to the contact pin 42, and another end is bifurcated. One bifurcated end is connected to another terminal of the DC jack 50, and another bifurcated end is connected to one terminal of the switch 60. The wire 49 is, for example, a signal line. One end of the wire 49 is connected to the contact pin 43, and another end is connected to another terminal of the switch 60.

The DC jack 50 is secured to the plate 45. The DC jack 50 includes an insertion unit (not illustrated) to which a detachable DC plug of an alternating current (AC) adaptor 70 (DC power supply) is inserted, and includes two terminals. The AC adapter 70 includes an AC plug and the DC plug. The AC plug of the AC adapter 70 is connected to an AC power supply (e.g., utility power). The DC plug of the AC adapter 70 is connected to the insertion unit of the DC jack 50. When the AC plug of the AC adaptor 70 s connected to an AC power supply (e.g., utility power) and the DC plug is connected to the insertion unit of the DC jack 50, a DC voltage is applied across the contact pin 41 and the contact pin 42.

The switch 60 is secured to the plate 45. The switch 60 is, for example, a normally opened momentary switch. For example, the switch 60 can be energized only while the switch 60 is pressed. In such a case, when the switch 60 is turned on, the contact pin 43 and the contact pin 42 can become conductive. In contrast, when the switch 60 is turned off, conduction between the contact pin 43 and the contact pin 42 is interrupted.

Substrate-like Sensor 200

Figure 4:
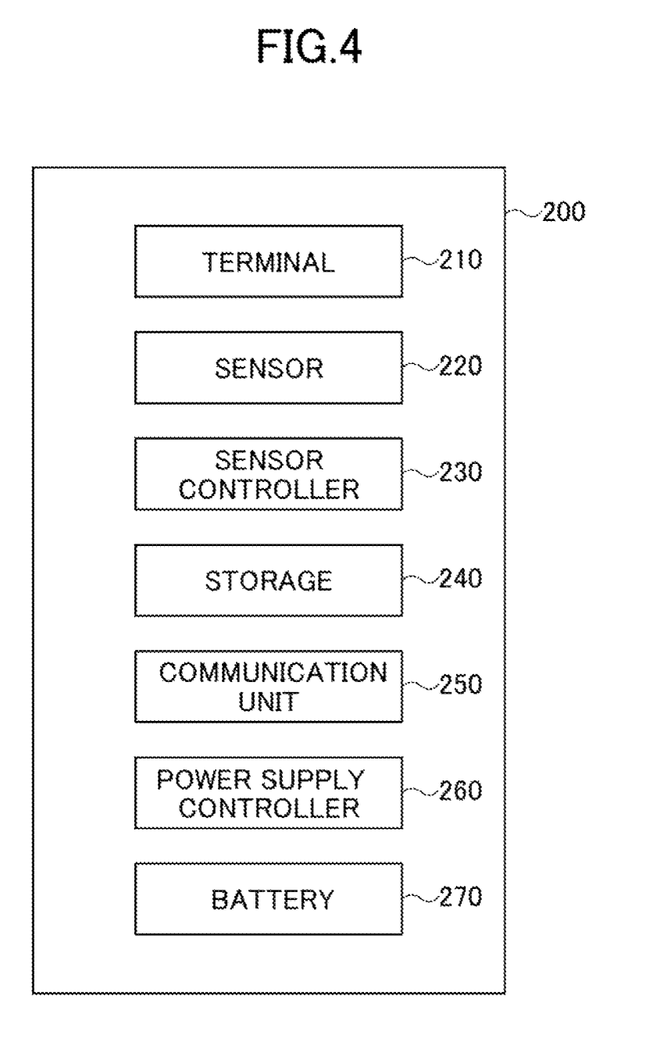
FIG. 4 is a block diagram illustrating an example of the configuration of a substrate-like sensor to be accommodated in the container according to one embodiment.

Hereafter, the substrate-like sensor 200 to be accommodated in the container 1 will be described with reference to FIG. 4. FIG. 4 is a block diagram illustrating an example of the configuration of the substrate-like sensor 200 to be accommodated in the container 1 according to the present embodiment.

The substrate-like sensor 200 includes a terminal 210, one or more sensors 220, a sensor controller 230, a storage 240, a communication unit 250, a power supply controller 260, and a battery 270.

The terminal 210 is provided at the central portion of the front side of the substrate-like sensor 200. The terminal 210 has a terminal array corresponding to the arrangement of the contact pins 41 to 43.

The sensor 220 is a sensor for inspecting the semiconductor manufacturing apparatus 100. Examples of the sensor 220 may include a temperature sensor, a capacitance sensor, a humidity sensor, an acceleration sensor, an image sensor, and the like.

The sensor controller 230 controls the sensor 220 to obtain a detected value. The sensor controller 230 also controls the storage 240 to cause the obtained detected value of the sensor 220 to be stored in the storage 240. Further, the sensor controller 230 controls the communication unit 250 to externally transmit at least one detected value among a detected value by the sensor 220 and a detected value by the sensor 220 stored in the storage 240. The sensor controller 230 can be communicatively connected to an external terminal (not illustrated) through the communication unit 250. Thus, a control signal from the external terminal is transmitted to the sensor controller 230, thereby enabling the operation of the sensor controller 230 to be controlled.

The power supply controller 260 has a function of determining whether DC power is supplied to the substrate-like sensor 200. If DC power is supplied to the substrate-like sensor 200, the power supply controller 260 causes each of the sensor 220, the sensor controller 230, the storage 240, and the communication unit 250 to be driven by the supplied DC power. The power supply controller 260 also causes the battery 270 to be charged by the supplied DC power. In contrast, if DC power is not supplied to the substrate-like sensor 200, the power supply controller 260 causes each of the sensor 220, the sensor controller 230, the storage 240, and the communication unit 250 to be driven by power supplied from the battery 270.

Hereafter, an example of use of the container 1 according to the present embodiment will be described. In the following description, a case in which a function of charging the substrate-like sensor 200 is implemented by the container 1 will be described.

As illustrated in FIG. 2, the substrate-like sensor 200 is accommodated in the container 1. In this case, the front opening of the main body 10 is in s state of being closed by the cover 20. Specifically, the right and left peripheries of the back side of the substrate-like sensor 200 are supported by the eighth stage teeth 11, and the central portion of the back side of the substrate-like sensor 200 is supported by the support 30 (supporting block 31).

An operator inserts the DC plug of the AC adaptor 70 into the DC jack 50 and connects the AC plug to an AC power supply (utility power).

The operator then operates the lifting mechanism 46 to cause the shaft member 44 to be lowered, so that the contact pins 41 to 43 become in contact with the terminal 210 of the substrate-like sensor 200. In this case, the contact pins 41 to 43 press against the central portion of the front side of the substrate-like sensor 200. The central portion of the back side of the substrate-like sensor 200 is supported by the support 30 (supporting block 31). Thus, deflection and damage of the substrate-like sensor 200 can be prevented. Further, contact pressure between each of the contact pins 41 to 43 and the terminal 210 can be increased.

In such a manner, a charging voltage is applied from the AC adapter 70 to the terminal 210 of the substrate-like sensor 200, through the DC jack 50, the wires 47 and 48, and the contact pins 41 and 42. When the charging voltage is applied to the terminal 210, the power supply controller 260 causes the battery 270 to be charged.

Note that the substrate-like sensor 200 may be provided with a light-emitting diode (LED) (not illustrated) indicating a state in which the battery 270 is charged. For example, the LED indicates the state in which the battery 270 is charged with a lighting pattern or color. Thus, outside the container 1, it is possible to identify whether the charging function is implemented normally. Further, the state in which the battery 270 is charged can be identified outside the container 1.

As described above, in the container 1 according to the present embodiment, the battery 270 of the substrate-like sensor 200 can be charged without removing the substrate-like sensor 200 from the container 1. Further, moisture or the like generated when the substrate-like sensor 200 is removed from the container 1 can be prevented from being adsorbed into the substrate-like sensor 200. Additionally, charging operation by the operator can be simplified.

The sensor 220 and the like are mounted on the disk of the substrate-like sensor 200. In such a manner, in some cases, a plate thickness of the disc of the substrate-like sensor 200 may be set to be thinner than the thickness of the wafer W. In the container 1 according to the present embodiment, when the contact pins 41 to 43 contact the terminal 210, the back side of the substrate-like sensor 200 is supported by the support 30 (supporting block 31). Thus, deflection and damage of the substrate-like sensor 200 can be prevented.

Further, in the container 1 according to the present embodiment, the contact pins 41 to 43 contact the terminal 210 of the substrate-like sensor 200 to thereby supply power to the substrate-like sensor 200. When the substrate-like sensor 200 accommodated in the container is wirelessly powered, an antenna (coil) and the like for electrically transmitting power are to be disposed in the container. Particles generated from material of the antenna and the like for electrically transmitting power might influence the process of the wafer W in each of the substrate process modules PM1 to PM6. In this regard, in the container 1 according to the present embodiment, material of each of members (the support 30, the contact pins 41 to 43, and the shaft member 44) disposed in the container 1 can be selected such that the material has little influence on the process of the wafer W in each of the substrate process modules PM1 to PM6.

Hereafter, an example of another use of the container 1 according to the present embodiment will be described. In the following description, a case in which the substrate-like sensor 200 accommodated in the container 1 operates with an external power supply will be described.

As illustrated in FIG. 2, the substrate-like sensor 200 is accommodated in the container 1. In this case, the front opening of the main body 10 is in a state of being closed by the cover 20. Specifically, the right and left peripheries of the back side of the substrate-like 200 are supported by the eighth stage teeth 11, and the central portion of the back side of the substrate-like sensor 200 is supported by the support 30 (supporting block 31).

An operator inserts the DC plug of the AC adaptor 70 into the DC jack 50 and connects the AC plug to an AC power supply (utility power).

The operator then operates the lifting mechanism 46 to cause the shaft member 44 to be lowered, so that the contact pins 41 to 43 become in contact with the terminal 210 of the substrate-like sensor 200. In such a manner, the charging voltage is applied from the AC adapter 70 to the terminal 210 of the substrate-like sensor 200, through the DC jack 50, the wires 47 and 48, and the contact pins 41 and 42.

The operator operates the switch 60 to thereby start the power supply controller 260. In this case, the sensor 220, the sensor controller 230, the storage 240, and the communication unit 250 are each driven by external power that is supplied to the terminal 210.

As described above, in the container 1 according to the present embodiment, the sensor controller 230 of the substrate-like sensor 200 can start without removing the substrate-like sensor 200 from the container 1. Further, by driving the sensor controller 230 and the like with external power, consumption of the charge amount of the battery 270 can be reduced.

By starting the sensor controller 230, for example, information stored in the storage 240 can be transmitted to an external terminal (not illustrated) via the communication unit 250. Accordingly, the external terminal can acquire information in the semiconductor manufacturing apparatus 100 detected the substrate-like sensor 200.

Hereafter, an example of still another use of the container 1 according to the present embodiment will be described. In the following description, preparation for inspecting the semiconductor manufacturing apparatus 100 will be described using the substrate-like sensor 200 accommodated in the container 1.

As illustrated in FIG. 2, the substrate-like sensor 200 is accommodated in the container 1. In this case, the front opening of the main body 10 is in a state of being closed by the cover 20. Specifically, the right and left peripheries of the back side of the substrate-like sensor 200 are supported by the eighth stage teeth 11, and the central portion of the back side of the substrate-like 200 is supported by the support 30 (supporting block 31).

The operator then operates the lifting mechanism 46 to cause the shaft member 44 to be lowered, so that the contact pins 41 to 43 become in contact with the terminal 210 of the substrate-like sensor 200.

Then, the operator operates the switch 60 to thereby start the power supply controller 260. In this case, the sensor 220, the sensor controller 230, the storage 240, and the communication unit 250 are driven by power that is supplied by the battery 270. In such a manner, the sensor controller 230 is communicatively connected to an external terminal (not illustrated) via the communication unit 250. Note that when a signal indicating an instruction to start recording is received via the communication unit 250, the sensor controller 230 records one or more detected values by the sensor 220. Further, when the sensor controller 230 receives a signal indicating an instruction to finish recording, via the communication unit 250, the sensor controller does not record a detected value by the sensor 220.

Then, the operator operates the lifting mechanism 46 to cause the shaft member 44 to be raised, so that the contact pins 41 to 43 separate from the terminal 210 of the substrate-like sensor 200.

Then, the operator attaches the container 1 accommodated in the substrate-like sensor 200, to the load port LP1.

The controller 110 controls each component of the semiconductor manufacturing apparatus 100. First, the controller 110 controls the load port LP1, to open the cover 20 of the container 1. Then, the controller 110 controls a transfer device (not illustrated) of the loader module LM, causing the end effector 120 to be inserted into the main body 10, and causing the substrate-like sensor 200 to be removed from the main body 10 (see FIG. 3). Subsequently, the substrate-like sensor 200 is transferred to a set position by the transfer device VA of the vacuum transfer Module VTM and a transfer device (not illustrated) of the loader module LM. The transferred substrate-like sensor 200 is then accommodated in the main body 10, and the cover 20 of the container 1 becomes closed.

As described above, in the container 1 according to the present embodiment, the sensor controller 230 of the substrate-like sensor 200 can start without removing the substrate-like sensor 200 from the container 1. Also, the sensor controller 230 of the substrate-like sensor 200 can start immediately before the semiconductor manufacturing apparatus 100 is inspected using the substrate-like sensor 200. Thus, consumption of the charge amount of the battery 270 can be reduced.

The embodiments and the like of the container 1 have been described above, but are not limiting. While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

An example of the configuration in which the shaft member 44 passes through the upper wall of the container 1 and the lifting mechanism (shaft driving mechanism) 46 causes the shaft member 44 to move axially has been described above. However, such a configuration is not limited to the example described above. A configuration in which a shaft member passes through the sidewall of the container 1 and a rotation mechanism (shaft driving mechanism) causes a shaft member to rotate, may be adopted. In this configuration, for example, the shaft member includes beam members each extending radially from the shaft member, and the contact pins 41 to 43 are secured to respective end portions of the beam members. With such a configuration, in response to rotating the shaft member, the beam members rotate and thus the contact pins 41 to 43 provided at the end portions of the beam members can be raised or lowered by an arc motion. In such a case, a state of the contact pins 41 to 43 can be switched between a state of contacting the terminal 210 of the substrate-like sensor 200 and a state of being away from the terminal 210 of the substrate-like sensor 200.

An accommodating unit (not illustrated) for a hygroscopic agent may be provided in the container 1. With such a manner, water can be prevented from entering the semiconductor manufacturing apparatus 100 through the substrate-like sensor 200.

According to one aspect of the present disclosure, a container for a substrate-like sensor and a method for charging a substrate-like sensor can be provided.

What is claimed is:

1. A container for a substrate-like sensor including a terminal, the container comprising:
    a main body having an opening;
    a support disposed in the main body and configured to support the substrate-like sensor;
    an energizable contact pin disposed in the main body and configured to contact the terminal of the substrate-like sensor;
    a drive mechanism configured to drive the energizable contact pin;
    a jack disposed outside the main body and electrically connected to the energizable contact pin, such that a charging voltage from the jack is permitted to be applied to the terminal of the substrate-like sensor through the energizable contact pin; and
    a cover for allowing the opening of the main body to be closed.

2. The container according to claim 1, further comprising a switch disposed outside the main body and electrically connected to the energizable contact pin.

3. The container according to claim 1, wherein the terminal of the substrate-like sensor is disposed on the front side of the substrate-like sensor, and
    wherein the support includes a supporting member for supporting the back side of the substrate-like sensor at a location at which the terminal of the substrate-like sensor is provided.

4. The container according to claim 1, wherein the container is configured to be attached to a load port on which a carrier for accommodating a substrate is mountable.

5. The container according to claim 1, wherein the main body includes a wall surface, and
    wherein the drive mechanism includes a shaft member and a shaft driving mechanism, the shaft member being provided through the wall surface of the main body and supporting the energizable contact pin inside the main body, and the shaft driving mechanism being disposed outside the main body and configured to axially drive the shaft member.

6. The container according to claim 1, wherein the main body includes a wall surface, and
    wherein the drive mechanism includes a shaft member and a shaft driving mechanism, the shaft member being provided through the wall surface of the main body and supporting the energizable contact pin inside the main body, and the shaft driving mechanism being disposed outside the main body and configured to rotate the shaft member.

7. The container according to claim 5, further comprising a wire via which the energizable contact pin and the jack are electrically connected together, the wire being in an interior of the shaft member.

8. A method for charging a substrate-like sensor accommodated in a container that includes a main body having an opening, a support disposed in the main body and configured to support the substrate-like sensor, the substrate-like sensor including a terminal, an energizable contact pin disposed in the main body and configured to contact the terminal of the substrate-like sensor, a drive mechanism configured to cause the energizable contact pin to be driven, a jack disposed outside the main body and electrically connected to the energizable contact pin, and a cover for allowing the opening of the main body to be closed, the method comprising:
    causing the energizable contact pin to contact the terminal of the substrate-like sensor, by the drive mechanism; and
    electrically connecting a DC power supply to the jack, such that a charging voltage from the DC power supply to the jack is permitted to be applied to the terminal of the substrate-like sensor through the energizable contact pin.

9. A container for a substrate-like sensor including a terminal, the container comprising:
    a main body having an opening;
    a support disposed in the main body and configured to support the substrate-like sensor;
    a contact pin disposed in the main body and configured to contact the terminal of the substrate-like sensor;
    a drive mechanism configured to drive the contact pin;
    a jack disposed outside the main body and electrically connected to the contact pin;
    a cover for allowing the opening of the main body to be closed,
    wherein the container is configured to be attached to a load port on which a carrier accommodating a substrate is mountable, and
    wherein the contact pin is energizable from the jack to allow energization of the terminal of the substrate-like sensor supported by the support, within the main body.

* * * * *